United States Patent [19]

Machita et al.

[11] Patent Number: 4,981,074
[45] Date of Patent: Jan. 1, 1991

[54] METHOD AND APPARATUS FOR SCREEN PRINTING

[75] Inventors: Tetuji Machita, Kitasoma; Norio Murata, Tokuyama; Toshihiko Takeda, Tokyo; Noriaki Mukai, Toride, all of Japan

[73] Assignee: Hitachi Techno Engineering Co., Ltd., Tokyo, Japan

[21] Appl. No.: 359,631

[22] Filed: May 31, 1989

[30] Foreign Application Priority Data

Jun. 1, 1988 [JP] Japan .................. 63-132757
Jun. 29, 1988 [JP] Japan .................. 63-159170

[51] Int. Cl.⁵ .................. B41F 17/00; B41F 15/08
[52] U.S. Cl. .................. 101/35; 101/126; 101/129; 198/345.1
[58] Field of Search .................. 101/35, 126, 129; 198/345

[56] References Cited

U.S. PATENT DOCUMENTS

| | | | |
|---|---|---|---|
| 3,416,440 | 12/1968 | Miller et al. | 101/35 |
| 3,459,125 | 8/1969 | Forslund | 101/35 |
| 3,486,441 | 12/1969 | Hillman et al. | 101/126 X |
| 3,543,679 | 12/1970 | Wahl | 101/35 |
| 4,397,385 | 8/1983 | Booth et al. | 198/345 |

FOREIGN PATENT DOCUMENTS

| | | | |
|---|---|---|---|
| 0259776 | 3/1988 | European Pat. Off. | 101/126 |
| 3142794 | 5/1982 | Fed. Rep. of Germany | 101/126 |
| 2232446 | 1/1975 | France | 101/126 |
| 0065557 | 5/1980 | Japan | 101/126 |
| 0044656 | 4/1981 | Japan | 101/126 |
| 0058866 | 5/1981 | Japan . | |
| 0051466 | 3/1982 | Japan . | |
| 0152355 | 7/1986 | Japan . | |
| 0216387 | 9/1986 | Japan . | |

Primary Examiner—Clifford D. Crowder
Attorney, Agent, or Firm—Antonelli, Terry, Stout & Kraus

[57] ABSTRACT

A method and apparatus for printing an electronic circuit on a board by screen printing. A board to be printed is transported from a supply/discharge station to a positioning station and then to a printing station and is returned to the supply/discharge station. At the positioning station spaced from the printing station, positioning of the board is effected by an image processor and an XYθ table. The board thus positioned is transported to the printing station while the board is kept in the positioned state. At the printing station, a screen printing is effected on the thus correctly positioned board.

24 Claims, 9 Drawing Sheets

METHOD AND APPARATUS FOR SCREEN PRINTING

BACKGROUND OF THE INVENTION

1. Field of the Invention

This invention relates to a method of printing components of an electronic circuit on a base in the form of a plate by screen printing and to an apparatus used therefor. More particularly, this invention relates to screen printing method and apparatus suitable for performing positioning of the base and printing on the same in a flow production manner.

2. Description of the Prior Art

In an ordinary conventional screen printing system for printing an electronic circuit on a board, the board is placed on an XYθ table and is supported by being attracted thereto or by a chuck, the XYθ table is moved by an image processor to position the board, and printing is thereafter performed on the XYθ table. In a case where this conventional art is applied to screen printing, however, a problem is encountered in that printing cannot be performed while positioning is being performed or positioning cannot be performed during printing, since the board is printed while being placed on the XYθ table. Therefore this system cannot be designed for flow production.

Japanese Patent Unexamined Publication No. 61-152355 discloses method and apparatus in which component parts are placed on an index table and are successively handled and processed. Techniques disclosed therein are mainly intended to read image information on, e.g., the shapes of component parts by an image processor with a video camera or the like and to handle the component parts on the basis of the results of reading. Thus, the proposed techniques are not directly concerned with screen printing. The index table disclosed in Japanese Patent Unexamined Publication No. 61-152355 is a means for simply supporting and transporting boards. Data obtained by the image processor is temporarily stored in a register and is compared by calculation with reference values previously stored, thereby adjusting the position of the printing unit to that of the board. In this process, the printing unit is moved together with the board. It is therefore difficult to maintain the desired printing accuracy.

Other types of conventional art are disclosed in U.S. Pat. No. 3,543,679 and Japanese Patent Unexamined Publication Nos. 57-51466, 56-58866 and 61-216387.

U.S. Pat. No. 3,543,679 and Japanese Patent Unexamined Publication No. 57-51466 each disclose a system in which an article to be printed is supplied from one article supply position onto a circular index table and fixed to the index table and is transported to a screen printing position, printing is effected on the article at the screen printing position by a screen printing unit, and the printed article is transported to a discharge position by the index table and is then discharged from the index table.

In this process, the article is transported to the screen printing position while being positioned in place by pins or a frame and fixed to the index table. In recent printed electronic circuits, however, the printed lines are each of a decreased width or thickness and spaced from each other by decreased distance than in the prior art printed circuits. In some cases, moreover, after a printed circuit has been fixed by heat, another circuit is printed in superposed relationship to the printed circuit already made. The recent printed circuits, therefore, demand a much increased positioning accuracy which cannot be achieved by the conventional mechanical positioning means, such as the combination of pins and associated holes which inevitably involves a play therebetween. Furthermore, in the case where circuits are printed one on the other in superposed relationship with each other, the printed articles are subjected to non-uniform strains generated therein when the articles are heated to fix the printed circuits. Due to the non-uniform strains, the positions of the printed circuits relative to the positioning pin holes in the printed boards or to the outer edges thereof are varied between different printed boards. Accordingly, the use of the conventional mechanical positioning means leads to the production of inaccurate prints on articles.

Japanese Patent Unexamined Publication No. 56-58866 discloses a printing system including a printing base of a polygonal cross section which is adapted to be rotated intermittently over an angle corresponding to the angle formed by each side of the polygon about the axis of rotation which extends horizontally. A board is positioned by pins relative to the surface of the lowermost side of the polygonal printing base and attracted to and held on the surface. A plurality of boards are successively attached to successive sides of the polygonal printing base and are upwardly transported by the rotation of the printing base to a screen printing position disposed above the printing base to effect printings on respective boards thus fed to the printing unit. As in the prior art already discussed above, however, the positioning of the boards to surfaces of respective sides of the polygonal printing base also relies upon mechanical positioning means which fail to assure an accurate positioning. The prior art in question, therefore, also has a problem similar to those of the prior arts previously discussed.

Japanese Patent Unexamined Publication No. 61-126387 discloses a screen printing system which employs an image pickup tube and a monitor TV so as to assure an accurate positioning of a board by a positioning mark on the board. The system comprises two embodiments in one of which a board and a screen printing unit are moved to a positioning station. In the other embodiment of the system, image pickup tubes are provided in positioning station and printing station, respectively. Boards are placed on and moved by a table successively to the positioning station where the positioning mark on each board is picked up and displayed on the monitor TV. The position of the table is adjusted until the positioning mark displayed on the monitor TV is registered with a predetermined cursor the position of which has been set in advance by directly displaying on the monitor TV a positioning mark on a printing screen and adjusting the position of the cursor until the cursor is registered with the positioning mark on the screen displayed on the monitor TV. Then, the board is moved by the table to the printing station under the screen printing unit, so that a printing is effected on the board. This prior art suffers from a problem that the system is not operative to simultaneously carry out a positioning of a board and a printing on another board and, thus, falls short of providing satisfaction in terms of productivity.

SUMMARY OF THE INVENTION

An object of the present invention is to provide screen printing method and apparatus which are improved in the view point of accuracy of prints and productivity.

To achieve this object, the present invention provides an arrangement including a supply/discharge station where boards are supplied and discharged, a positioning station where a recognition mark of each board is detected and where a board support on which the board is supported and attracted thereto is positioned by means of an $XY\theta$ table operable by a command of an image processor, a printing station where printing is effected on the board transported while being maintained in the positioned state, and a transportation means for guiding the board with a desired accuracy. A return preparation station in which the printing board is returned to the supplied position may also be provided to facilitate the operation of a loader for supplying and discharging boards, thereby further improving the productivity.

In accordance with one embodiment of the present invention, the board is kept attracted to the board support after it has been attracted to and supported on the board support at the supply/discharge station. The board support is attracted to the transportation means except when the attraction is cancelled at the positioning station and at the return preparation station, thereby enabling the board to be transported to the printing station while being maintained in the position determined at the positioning station. In a case where the transportation means is constituted by a plurality of guides defining a rectangle, at least the positioning station and the printing station are disposed on the same guide, thereby enabling the maintenance of the desired accuracy of transportation between these stations. If an examination station is added to this arrangement, it is preferable to dispose the examination station subsequently to the above two stations. In this case, board supports and transportation tables on which board supports are placed are circulated while being guided by the guides and can be used repeatedly. The guides may comprise linear guides each of a well-known type of rolling bearing constituted by rollers interposed between a pair of rails. This type of guide is preferable because it is capable of operating with reduced friction and easy maintenance. In a case where a circular table is used as the transportation means, it is preferable to provide a vertically movable attraction/support member in the vicinity of the peripheral edge of the circular table to support the table at the time of printing and to prevent the table from being deformed by the printing pressure, thereby maintaining the accuracy.

At the positioning station, the camera for reading the recognition mark of the board and the $XY\theta$ table may preferably be disposed so as to face each other, thereby enabling not only positioning of the board but also confirmation of the result of positioning to be conducted. It is also possible to collate the result of printing at the printing station with the reference by transporting a printed board as a specimen to the positioning station again.

The transportation table may be provided with operating value means which may include a mechanical value adapted to be operated by engagement with a certain means disposed outside the table to attract the board support to the transportation table and to cancel this attraction and an electric valve driven by a signal transmitted from an optical signal controller disposed outside the table.

In accordance with the present invention, positioning of the board and printing thereon are performed at different stations, and the board can be transported between these stations while being maintained in the suitably positioned state, thereby enabling a printing process, which needs to be conducted with accuracy, to be carried out in a flow production manner and with an improved productivity. The transportation of boards is continued in a circulating manner. For example, board supports and tables each having a vacuum source and operating valve means can be circulated for transportation of successive boards. An examination station can readily be provided additionally in the circulation path. In positioning station, the camera connected to the image processor and the $XY\theta$ table may be disposed so as to face each other to facilitate not only positioning of boards but also reconfirmation of the board position after positioning and confirmation of the result of printing with a specimen printed board, thus achieving printing with improved accuracy.

These and other objects, features and advantage of the present invention will be made more apparent by the following description with reference to the accompanying drawings.

DESCRIPTION OF THE PREFERRED EMBODIMENTS

Figure 1:
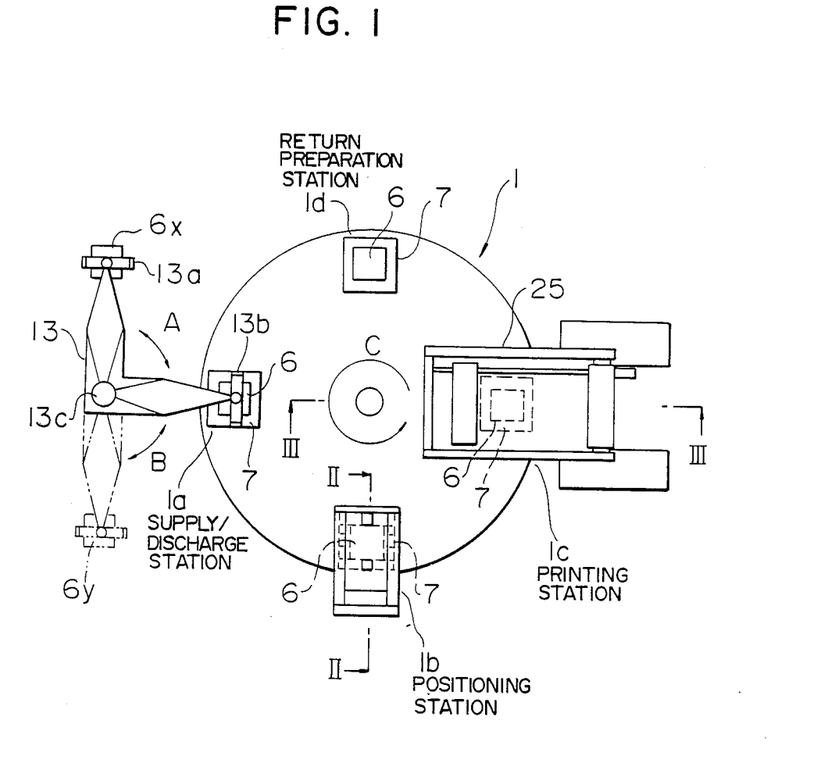
FIG. 1 is a plan view of an embodiment of a screen printing machine of the present invention.

Referring to FIG. 1, an index table generally designated by the reference numeral which serves as a transporting table is intermittently revolved in the direction of an arrow C so that the outer periphery of the table 1 successively passes through a supply/discharge station 1a where a board is supplied or discharged, a positioning station 1b, a printing station 1c and a return preparation station 1d. Four board supports 7 are provided on the index table 1 in the embodiment illustrated in FIG. 1. Boards 6 are placed on the respective board supports 7 by a loader 13 provided in the supply/discharge station 1a.

The loader 13 has a pair of arms extending perpendicularly to each other, with the arms have their free ends connected with attraction means 13a and 13b operable by vacuum to the boards 6. When the loader 13 is in a state indicated by the solid line in FIG. 1, a board 6x which has been transported by a conveyor (not shown) is being attracted and supported by the attraction means 13a, and a board 6 which has been moved from the return preparation station 1d to the supply/discharge station 1a is attracted and supported by the attraction means 13b. The loader 13 reciprocably rotates about a shaft 13c by 90° as indicated by arrows A and B. When the loader 13 is rotated clockwise by 90° from the state indicated by the solid line in FIG. 1, the board 6x is placed on the board support 7 of the index table 1 located at the supply/discharge station 1a, and a printed board which has been placed on the board 7 is moved to a position designated by 6y. The board 6y is thereafter transported by a conveyor (not shown) to a predetermined place. Boards 6 thus placed on the board supports 7 are successively moved to the stations 1b, 1c and 1d by the index table 1 and are discharged by the loader 13 when finally returned to the supply/discharge station 1a.

Figure 3:
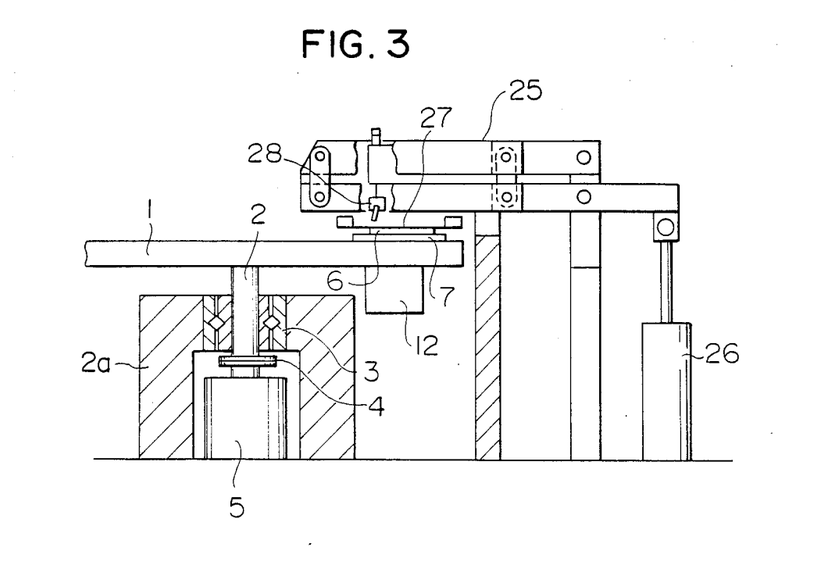
FIG. 3 is a cross-sectional view taken along the line III—III in FIG. 1.

As can be seen in FIG. 3, a rotary shaft 2 is fixed to the index table 1 at the center thereof and is rotatably supported by a bearing 3 on a support body 2a. The rotary shaft 2 is drivingly connected to a drive motor 5 through a shaft coupling 4.

A motor having a function of precisely indexing the index table 1 by rotating the index table 1 by a predetermined angle (90° in this embodiment) and stopping the table at a predetermined position is used as the drive motor 5. For example, the drive motor 5 may be a multipolar motor called "Megatorque Motor", commercial name of a product of Nippon Seiko K.K., Japan.

Figure 2:
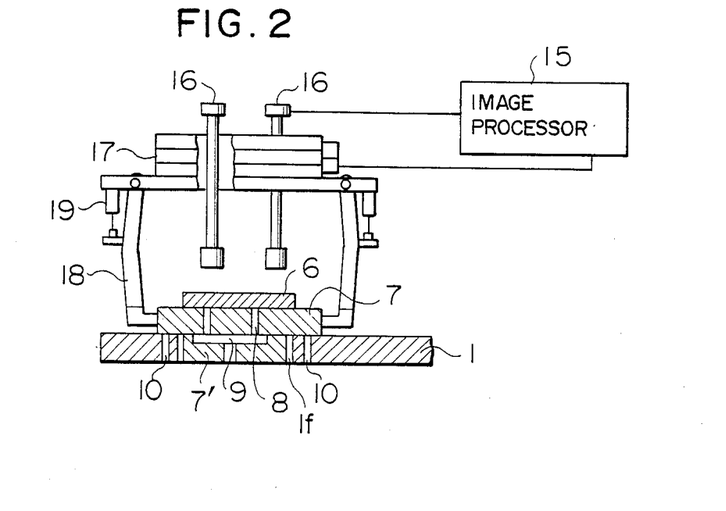
FIG. 2 is a cross-sectional view taken along line II—II in FIG. 1.

As can be seen in FIG. 2, each board support 7 has a portion 7' projecting downwardly from its lower surface. The projecting portion 7 is loosely fitted in a large hole if formed in the index table 1. The index table 1 has holes 10 for attracting the board support 7 by vacuum. The board support 7 and the downwardly projecting portion 7' have holes 8 for attracting a board 6 by vacuum and a passage 9 communicating with the holes 8. Pipings (not shown) connect the holes 10 and the communication passage 9 to a vacuum source 12 mounted on the lower surface of the index table 1 shown in FIG. 3. The holes 10 and the communication passage 9 can be evacuated to attract the board support 7 to the index table 1 and the board 6 to the board support 7 so that the board support 7 is fixedly supported on the index table 1 and the board 6 on the board support 7. When the application of vacuum to the holes 10 and the communication passage 9 is interrupted the board 6 becomes movable relative to the board support 7, and the board support 7 becomes movable relative to the index table 1.

Referring again to FIG. 2, an XYθ table 17 which is movable in each of the X-, Y- and θ-directions is provided in the positioning station 1b above the index table 1. The XYθ table 17 has a clamp 18 and a clamp driver 19. The clamp 18 is driven by the clamp driver 19 so as to clamp a board support 7.

A camera means 16 (a pair of cameras shown in FIG. 2) connected to an image processor 15 is disposed above the index table 1. The number of cameras of the camera means 16 may be selected as desired At the positioning station 1b, the camera means 16 and the image processor 15 cooperate to read a recognition mark (not shown) formed on each board 6. The image processor 15 compares the recognition mark thus read with a reference point on a printing mask (not shown) previously memorized by the image processor 15 to determine whether or not the mark and the reference point coincide with each other, and issues a signal to the XYθ table 17 to correct the position of the board 6 if the deviation of the recognition mark from the reference point is larger than an allowable value, This signal may be an optical signal or a radio wave signal. At that time, no vacuum is applied to the board support 7 so the board support 7 is movable relative to the index table 1. Therefore, the XYθ table 17 can move the clamp 18 and thus the board support 7 to the desired position, thereby making the recognition mark of the board 6 coincide with the reference point on the printing mask stored in the image processor 15.

The image processor 15 again issues a signal to the XYθ table 17 in order to assure that the recognition mark of the board 6 coincides with the reference point of a printing mask previously memorized by the image processor 15. Preferably, the image processor 15 is designed not only to perform this operation but also to confirm whether or not the recognition mark thus moved has actually coincided with the reference point and, if the recognition mark does not coincide with the reference point, the image processor 15 repeats the operation until the recognition mark is registered with the reference point.

A product of HITACHI TECHNO Engineering Co., Ltd. having a commercial name "IGS-256" may be used as the image processor 15, and a product of Hitachi, Ltd. having a commercial name "CCTV" may be used as the camera 16.

The board 6 positioned as described above is moved to the printing station 1c shown in FIG. 3. A screen printing unit 25 is disposed in the printing station 1c. The screen printing unit 25 has a mask 27 downwardly movable by a lift cylinder 26 to a predetermined position relative to the board 6. A squeegee 28 is caused to slide on the mask 27, thereby performing a screen printing on the board 6.

After the printing, the index table 1 is rotated so as to transport the printed board 6 to the return preparation station 1d and then to return the board 6 to the supply/discharge station 1a where the printed board 6 is discharged while a new board is placed on the index table 1, in the manner already described.

The board support 7 may be readjusted to the original position at the return preparation station 1d to enable a new board to be placed by the loader 13 at the desired position on the readjusted board support 7 and attracted when the new board is supplied. The accuracy with which the original position of the board support 7 is restored at the return preparation station 1d is not necessarily as high as that at the positioning station 1b. It is therefore sufficient to effect the readjustment at the return preparation station 1d by gripping side surfaces of the board support 7 by a well-known type of chuck (not shown) provided outside the index table 1.

Figure 4:
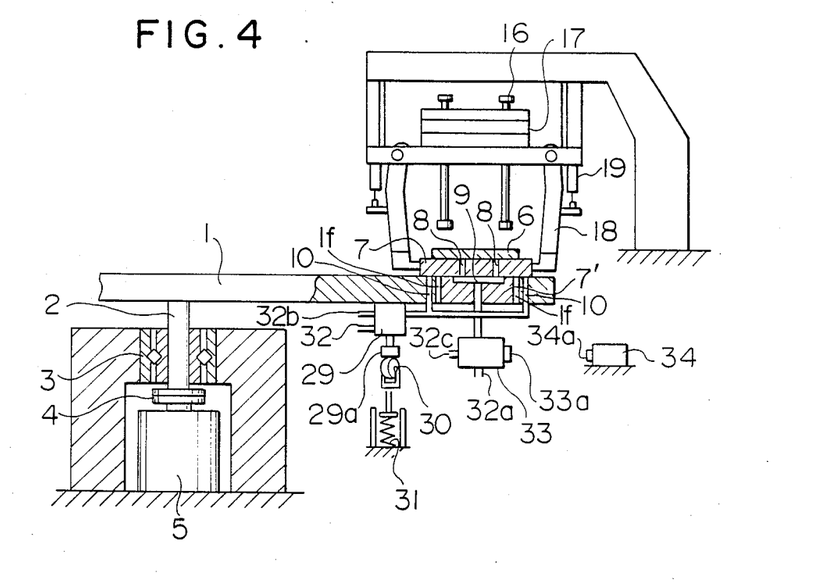
FIG. 4 is a partly sectional fragmentary view of the machine showing mechanical valve and an electric valve mounted on an index table.

Next, operations of attracting each board support 7 to the index table 1 and cancelling attraction will be described below with reference to FIG. 4. Mechanical valves 29 controlled by an external force are mounted on the lower surface of the index table 1, with each mechanical valve 29 being connected by a piping 32b to the vacuum source 12 shown in FIG. 3. The holes 10 of the index table 1 are evacuated through the mechanical valves 29 so that board supports 7 are attracted and fixed to the index table 1.

A roller 30 is disposed in the positioning station 1b and supported by a compression spring 31. The roller 30 is capable of engaging with a push rod 29a of each mechanical valve 29 so as to move the push rod 29a upward. As the index table 1 rotates, the push rod 29a is brought into engagement with the roller 30 and pushed upwardly so as to open a vent port 32. The holes 10 are therefore communicated with the atmosphere via the vent port 32, so that the attraction of the board support 7 to the index table is cancelled, thereby allowing the board support 7 to be moved for the purpose of positioning. At this time, the vacuum in the communication passage 9 is still maintained. That is, at the positioning station 1b, the board support 7 is made free to move relative to the index table 1 while the board 6 is fixed to the board support 7. Electric valves 33 are mounted on the index table 1 and serve as means for controlling the application of vacuum to the communication passage. The electric valves 33 are connected by pipings 32c to the vacuum source 12 shown in FIG. 3 and operate to enable evacuation of the communication passages 9 to attract and fix boards 6 to the board supports 7.

The attraction and fixation of a board 6 to the board support 7 is cancelled when this board 6 has been printed and discharged at the supply/discharge station 1a. More specifically, an optical signal transmitter 34 having a transmitting portion 34a is provided in the supply/discharge station 1a to release the printed board 6 from attraction and fixation to an associated board support 7. When the printed board 6 is returned to the supply/discharge station 1a, the optical signal transmitter 34 is operated by a control signal to emit light from the transmitting portion 34a. The electric valve 33 receives this light through its receiving portion 33a and opens the vent port 32a so as to make the communication passage 9 communicate with the atmosphere. The printed board 6 on the board support 7 is thereby made freely movable and able to be discharged by the loader 13.

In the above-described embodiment, the mechanical valves 29 and the electric valves 33 are provided. However, other types of valves having the same functions as those of the mechanical and electric valves 29 and 33 may alternatively be utilized. Such alternative valves may be of a mechanical type or an electric type.

Currents for driving the vacuum source 12 and the electric valves 33 are supplied from a power source provided outside the index table 1 via slip rings of a well-known type provided around the rotary shaft 2 of the index table. If it is desirable to readjust the position of the board supports 7 at the return preparation station 1d as described above, it is also necessary to provide the return preparation station 1d with a roller for operating the mechanical valves 29.

It is necessary for the shaft coupling 4 to be capable of transmitting the driving torque of the drive motor 5 to and capable of turning the index table 1 by 90° at a time and stopping the same with accuracy. Also, the shaft coupling 4 must be capable of firmly drivingly connecting the rotary shaft 2 to the drive motor 5 which may be a motor such as the above-mentioned Megatorque Motor (commercial name).

It is believed that the operation of this screen printing machine can be understood sufficiently from the above description. However, it will be summarized below.

A board on which circuit elements, resistances, solder, and so on are to be printed at desired positions is transported by the conveyor and is placed by the loader 13 on a board support 7 located at the supply/discharge station 1a while a printed board which has been placed on the board support 7 is discharged therefrom by the loader 13. The board 6 placed on the board support 7 is attracted by a vacuum applied by an associated electric valve 33 through the communication passage 9 and through the holes 8 in the board support 7 so that the board 6 is firmly fixed to the board support 7. A vacuum is applied by an associated mechanical valve 29 to the board support 7 through the holes 10 in the index table 1, thereby attracting the board support 7 so as to firmly fix the same to the index table 1.

The index table 1 is then turned by 90° by the drive motor 5 so that the board 6 is moved to the positioning station 1b. At the positioning station 1b, the roller 30 is brought into engagement with the push rod 29a of the mechanical valve 29, so that the vacuum in the holes 10 is eliminated, thereby allowing the board support 7 to be movable relative to the index table 1. The board support 7 is clamped by the clamp 18 of the XYθ table 17. The recognition mark on the board 6 attracted and fixed to the board support 7 is detected by the camera means 16. The board support 7 is moved by the XYθ table 17 so that the recognition mark coincides with the reference point on the printing mask memorized by the image processor 15, thus positioning the board 6. After positioning, the clamp 18 releases the board support 7 to the index table 1. The index table 1 starts rotating again while the board support 7 is being maintained in this positioned state and, at the same time, the roller 30 is disengaged from the push rod 29a. A vacuum is thereby applied through the holes 10 in the index table 1 so that the board support 7 is again attracted and fixed at the position determined by the positioning.

At the printing station 1c, a screen printing is effected on the positioned board 6 by the mask 27 and the squeegee 28. After printing, the printed board 6 and the board support 7 are transported to the return preparation station 1d. At the return preparation station 1d, the position of the board support 7 is adjusted by the chuck if necessary. Thereafter, the board 6 and the board support 7 are returned to the supply/discharge station 1a where the printed board 6 is released from the board support 7 and is discharged by the loader 13, as described above.

To start a rotation of the index table 1 after it has been stopped in each station, it is necessary that an index table drive control means (not shown) receives operation completion signals from all the stations. That is, each of the stations 1a, 1b, 1c and 1d transmits a signal representing the completion of its operation to the index table drive control means.

Other modifications and embodiments of the present invention will be described below in sequence. The same reference characters as those in FIGS. 1 to 4 designate equivalent or similar components.

Figure 5:
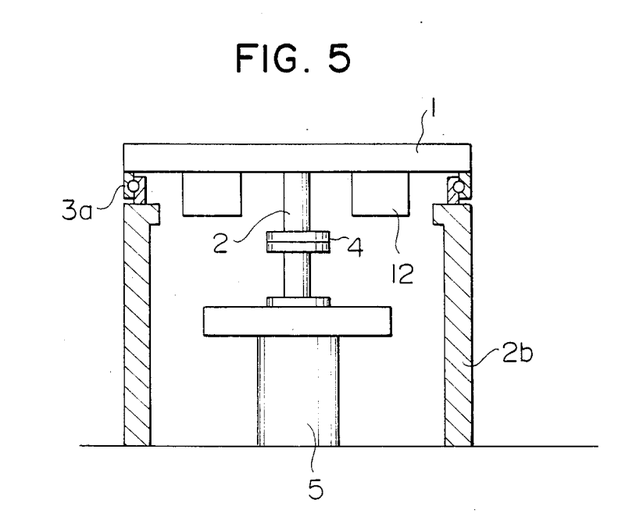
FIG. 5 illustrates another arrangement for rotatably supporting the index table.

FIG. 5 shows a modification to the structure of rotatably supporting the index table 1, in which the index table 1 is mounted on a cylindrical support 2b through a large-diameter rotary bearing 3a interposed between the lower surface of the outer peripheral portion of the table 1 and the cylindrical support 2b. This modified structure is advantageous because it enables the index table 1 to be prevented from being deformed by a vertical pressure at the time of printing.

Figure 6:
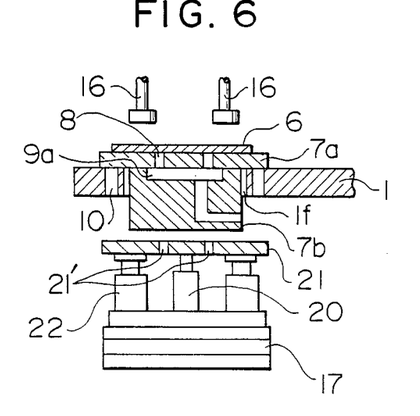
FIG. 6 illustrates another arrangement of the $XY\theta$ table in the positioning station.

FIG. 6 shows another example of the arrangement of the XY$\theta$ table 17 in the positioning station 1b. In this example, the XY$\theta$ table 17 is disposed below the index table 1. Each board support 7a has a projecting portion 7b formed on its lower end. The projecting portion 7b extends downward below the index table 1 through a hole 1f in the index table 1. The hole if in the index table 1 has a size substantially larger than that of the projecting portion 7b such that the projecting portion 7b can move in the horizontal direction to a certain extent relative to the index table 1. The projecting portion 7b has a communication passage 9a for attracting and fixing a board 6 to the board support 7a. The lower end of the communication passage 9a is opened laterally and is connected by a flexible hose (not shown) to the vacuum source. The flexible hose does not protrude downward beyond the under surface of the projecting portion 7b. The upper surface of a contact plate 21 which is moved in the vertical direction by a lift cylinder 20 provided on the XY$\theta$ table 17 can therefore be brought into contact with the under surface of the projecting portion 7b, thus supporting the board support 7a on the contact plate 21. The board support 7a is attracted to the contact plate 21 by vacuum applied through openings 21' formed in the plate 21 connected to the vacuum source by vacuum lines not shown. The contact plate 21 is guided by lift guides 22.

During positioning, the force of the vacuum to attract and fix the board support 7a to the index table 1 is cancelled and the board support 7a is attracted slightly lifted from the index table 1 by the contact plate 21 lifted by lift cylinders 20 on the XY$\theta$ table 17. The board support 7a is then moved by the XY$\theta$ table 17 so as to be positioned in the above-described manner. After positioning, the lift cylinder 20 is contracted, the board support 7a is attracted and fixed on the index table 1 while being maintained at the desired position and at the same time the board support 7a is freed relative to the contact plate 21.

Figure 7:
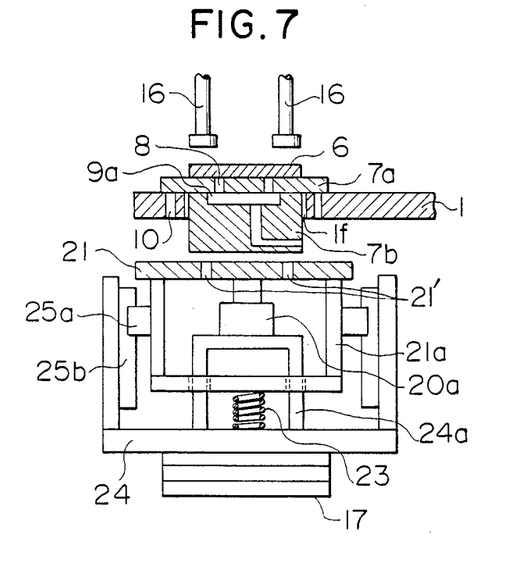
FIG. 7 illustrates a still another arrangement of the $XY\theta$ table in the positioning station.

The arrangement of FIG. 7 differs from that shown in FIG. 6 in that the contact plate 21 has a lift frame 21a which is urged upward by a spring 23 and that a lift cylinder 20a is designed to move the contact plate 21 downwardly against the force of the spring 23. The lift frame 21a is guided by guides 25a and 25b in the vertical direction. The guides 25b are mounted on an outer frame 24 which in turn is mounted on the XY$\theta$ table 17. An inner frame 24a is disposed inside the outer frame 24. The lift cylinder 20a is supported on the inner frame 24a. The spring 23 is interposed between the outer frame 24 and the inner frame 21a. Holes 21' can attract the projecting portion 7b.

Figure 8:
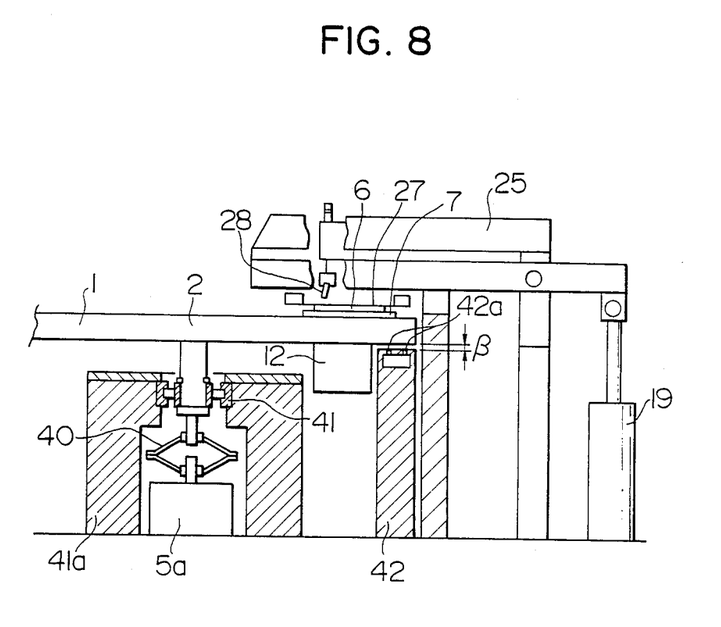
FIG. 8 illustrates a still another arrangement for rotatably supporting the index table.

FIG. 8 shows a stioll another arrangement for rotatably supporting the index table 1. The rotary shaft 2 is rotatably supported by a bearing 41 on a support 41a. The lower end of the rotary shaft 2 is connected to a drive motor 5a by a shaft coupling 40 expandable in the axial direction and having a rigidity in the rotational direction. The shaft coupling 40 is formed by a pair of dish-like steel plates which are connected to each other at their peripheral portions in a symmetrical relationship. The bearing 41 has a structure such that the rotary shaft 2 is not retained in the axial direction but is rotatable about its axis with a desired accuracy. A plurality of openings 42a are formed in an upper end portion of a cylindrical support member 42. The holes 42a can be evacuated by a second vacuum source (not shown) through a piping (not shown) to attract the index table 1 that has been rotatably supported by the shaft coupling 40 while being spaced apart from the upper end of the support member 42 by a small gap B, thereby fixing the index table 1 to the upper end of the support member 42.

When the index table 1 is not being rotated, the index table 1 is fixed to the support member 42 by vacuum against the reaction of the shaft coupling 40. When the index table 1 is rotated, the vacuum is cancelled to form the gap $\beta$, thereby allowing the index table 1 to rotate. It is therefore possible to effect positioning and printing with improved accuracy. For instance, the support member 42 supports the index table 1 at the desired position against a vertical force applied by the squeegee 28 at the time of printing, thereby enabling printing on a board 6 with the desired accuracy as well as preventing the index table 1 from being deformed by the printing pressure.

Figure 9:
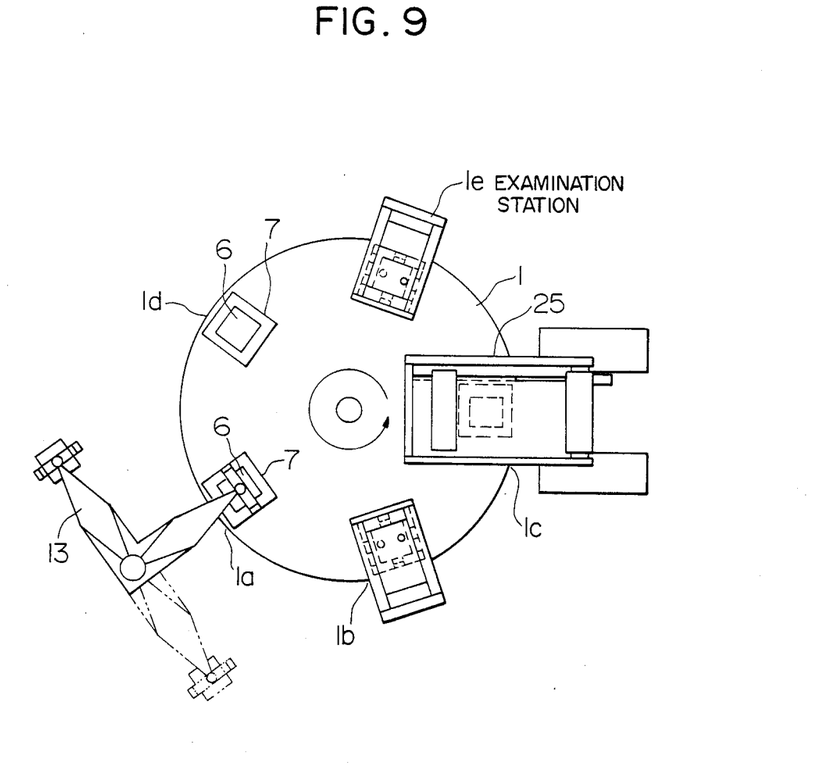
FIG. 9 is a plan view of another embodiment of the present invention.

In FIG. 9 embodiment an examination station 1e is provided for examining each printed board 6 with an image processor. The examination station 1e is provided between the printing station 1c and the return preparation station 1d. The index table 1 is intermittently rotated by 72° in order to successively perform flow process operations from the supply of boards to the discharge of the same.

In the above-described embodiments, the index table is rotated to transport the boards. The shape of the table is not limited to the circular one so long as the table is capable of transporting the boards to respective stations and stopping the same while maintaining the boards at the desired positions with accuracy. To maintain the desired stop position accuracy, well-known type of tapered pins may be inserted into the board support.

Figure 10:
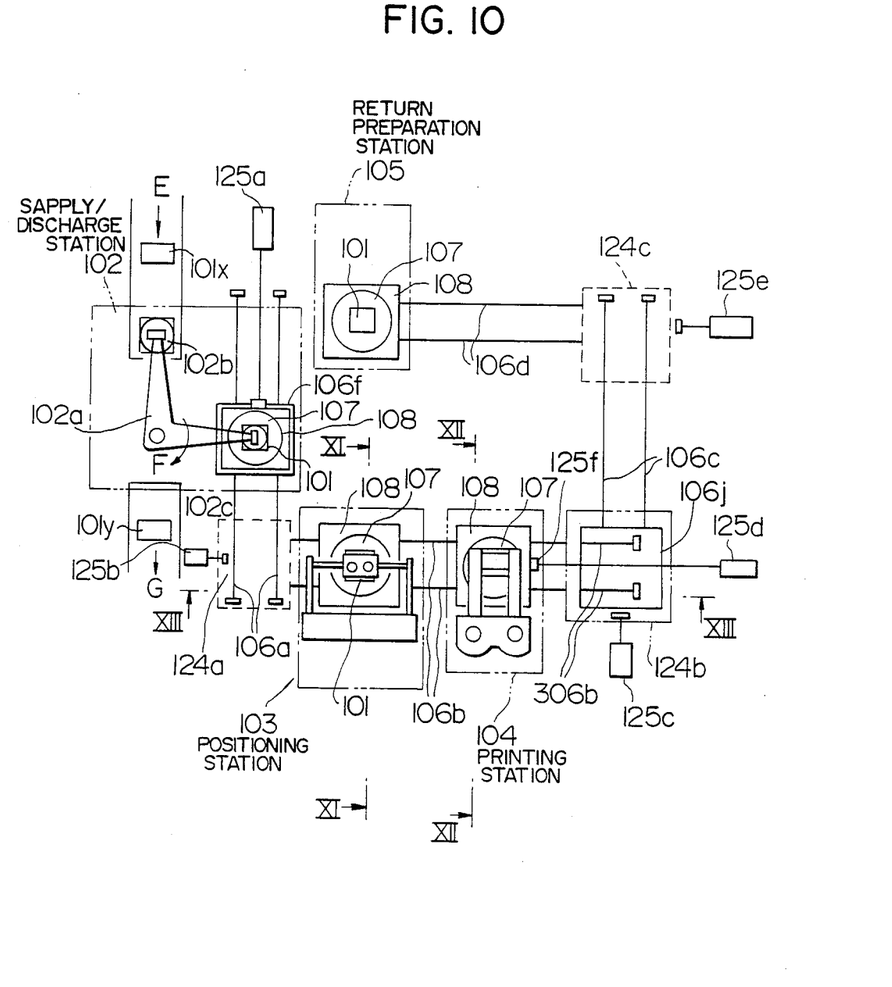
FIG. 10 is a plan view of a still another embodiment of the present invention.

As can be seen in the plan view of FIG. 10, a screen printing machine has, in place of the index table, a transportation means which moves along four sides of a rectangle defined by four pairs of rails, i.e., guides 106a to 106d. A supply/discharge station 102, a positioning station 103, a printing station 104 and a return preparation station 105 are disposed along the guides 106a to 106d. A traverse 106f is slidably reciprocally disposed on the guide 106a, and a traverser 106j on the guide 106c. Board support 107 for supporting boards 101 are supported on tables 108 which can be moved on the guide 106b and 106d. The tables 108 can also be moved along the guide 106a and 106c together with the traversers 106f and 106j on which the tables 108 are supported.

A board 101x which has been conveyed by a conveyor belt in the direction of the arrow E is attracted by an attraction means 102b of a loader 102a and is placed on one board support 107 disposed on a table 108 supported on the traverser 106f. At the same time, the loader 102a removes a printed board 101 by an attraction means 102c to a position represented by 101y. Thereafter, the board 101y can be discharged by a transportation belt in the direction of the arrow G. To transport the board 101 newly placed on the board support 107 on the traverser 106f, a cylinder means 125a moves the traverser 106f until the traverser 106f reaches a position 124a indicated by dot and dash lines. Then, a second cylinder means 125b rightwardly presses the table 108 placed on the traverser 106f so that the table 108, together with the board 101 and the board support 107 placed on the table 108, is moved away from the traverser 106f onto the guide 106b and moved therealong to the positioning station 103 where positioning is performed (as described later in detail). The table 108 is further moved by the cylinder means 125b on the guide 106b together with the board support 107 and the board 101 to the printing station 104 where screen printing is effected on the board 101. The table 108 on which the printed board 101 is placed is rightwardly drawn by a third cylinder means 125d having a rod end portion 125f engaging with the table 108 until the table 108 is moved onto a pair of sub-guides 106b provided on the traverser 106j placed in a position 124b indicated by double-dot-dash lines. The traverser 106j is then moved on the guide 106c by a further cylinder means 125c until it reaches a position indicated by a dash line 124c. The table 108 is then moved leftwardly on the guide 106d by a further cylinder means 125e until the table 108, the board support 107 and the printed board 101 reach the return preparation station 105. Then, the cylinder means 125a moves the table 108 onto the traverser 106f that has been returned by the cylinder actuator 125a from the position 124a to the end of the guide 106a at the top of FIG. 10, whereby the table 108 is returned to the original start position 102 shown in FIG. 10.

Figure 11:
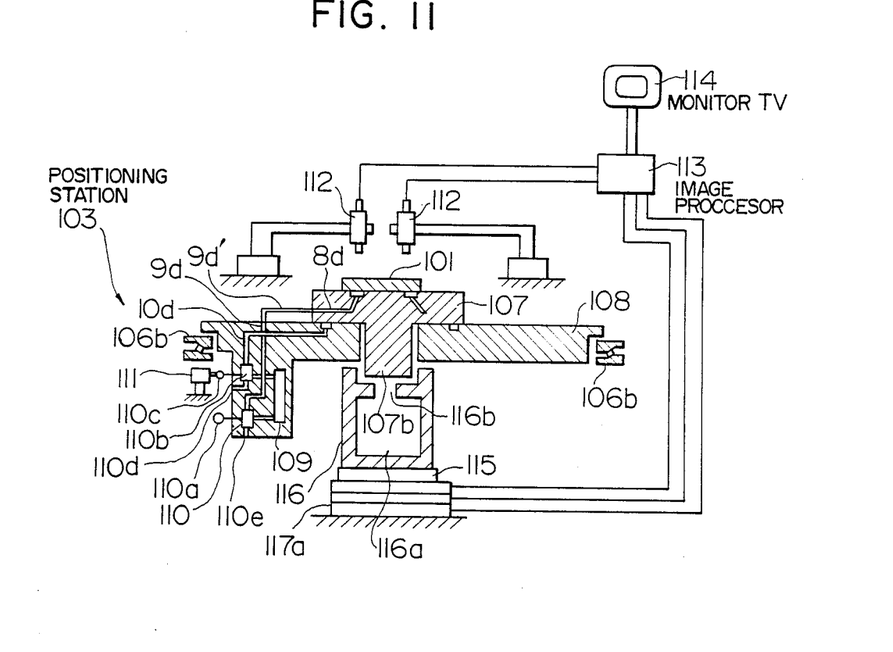
FIG. 11 is an enlarged cross-sectional view of the positioning station taken along line XI—XI in FIG. 10.

Referring then to FIG. 11, the positioning station 103 is provided with cameras 112, an image processor 113, a monitor TV 114 and an XYθ table 117a. A lift cylinder 115 is provided on the XYθ table 117a to move a cylindrical support 116 in the vertical direction. A chamber 116a is formed in the support 116. The chamber 116a can be evacuated through a piping (not shown) to attract a lower projection 107b of the board support 107 to openings 116b. in the support 116. The table 108 is provided with a vacuum source 109, a communication passage 9d for enabling holes 8d in the board support 107 and a flexible hose 9d' to be evacuated by the vacuum source 109 through a mechanical valve 110, and a passage 10d for enabling the vacuum source 109 to act through a second mechanical valve 110b to attract and fix the board support 107 on the table 108. The positioning station 103 is further provided with an actuator means 111 for operating a handle 110c of the mechanical valve 110b by engaging engagement with the actuator means 111, it is operated to cause the mechanical valve 110b to provide communication between the passage 10d and the atmosphere through a vent port 110d. The board support 107 is thus made movable relative to the table 108. Thereafter, the board support 107 can be positioned by the XYθ table 117a together with the support 116 that is disposed on the XYθ table and to which the board support 107 is attracted and secured. The mechanical valve 110 is operated to release the board 101 from the board support 107 in such a manner that an actuator means (not shown but substantially the same as the actuator means 111) of the supply/discharge station 102 engages with a handle 110a of the mechanical valve 110 and operates the same so as to communicate the communication passage 9d, the flexible hose 9d' and the holes 8d communicate with the atmosphere, thus enabling the board 101 to be removed from the board support 107 when returned to the supply/discharge station 102 after printing.

Figure 12:
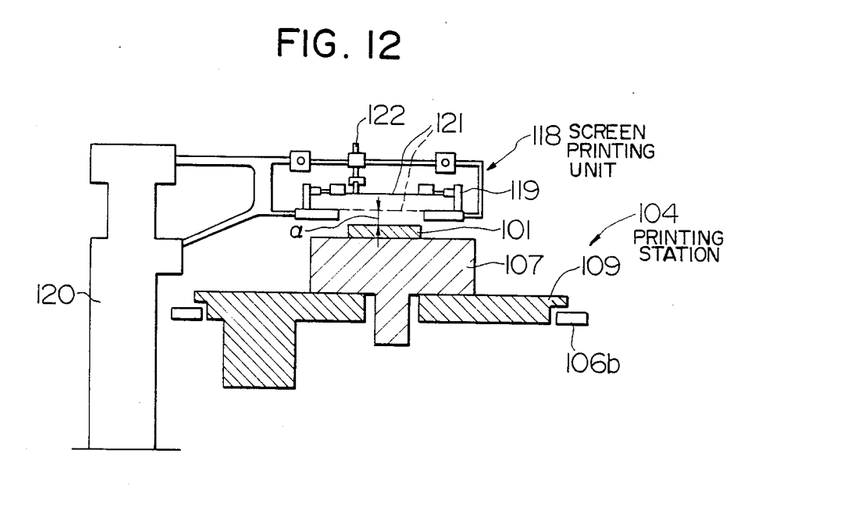
FIG. 12 is an enlarged cross-sectional view taken along line XII—XII in FIG. 10.

FIG. 12 shows the arrangement of the printing station 104 wherein a screen printing unit 118 includes a mask 121 supported on a base 120 and movable relative to the base 120 in the vertical direction by a lift means 119. At the time of printing, the mask 121 is moved downwardly to a position at which the distance between the upper surface of the board 101 and the mask 121 is a value $\alpha$ which is optimum for performed a printing by a squeegee 122.

Figure 13:
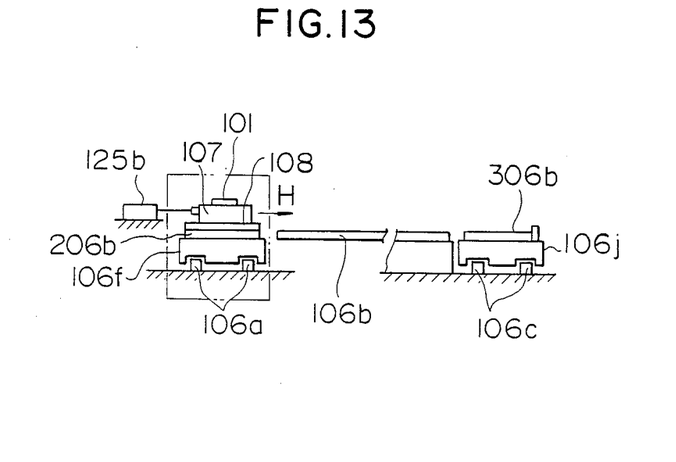
FIG. 13 is a side view taken along line XIII—XIII in FIG. 10.

FIG. 13 illustrates a state in which the table 108 supported on sub-guides 206 (shown in FIG. 13 alone) of the traverser 106f is moved onto the guide 106b in the direction of the arrow H by the cylinder means 125b.

As described above, the cylinder means 125b and 125d are used to move the table 108 from the positioning station 103 to the printing station 104 and to move the table 108 from the printing station 104 to the position 124b indicated by the double-dot-dash lines. However, the arrangement may be modified such that the position 124a, the positioning station 103 and the printing station 104, the position 124b and the size of the table 108 are determined so that, when a table 108 located on the traverser 106f is moved rightwardly by the cylinder means 125b, the table 108 moves another table 108 located in the positioning station 103 to the printing station 104, and the latter table 108 also moves a still another table 108 located in the printing station 104 onto the traverser 106j in the position 124b, thereby enabling the size of the cylinder 125b to be reduced.

Figure 14:
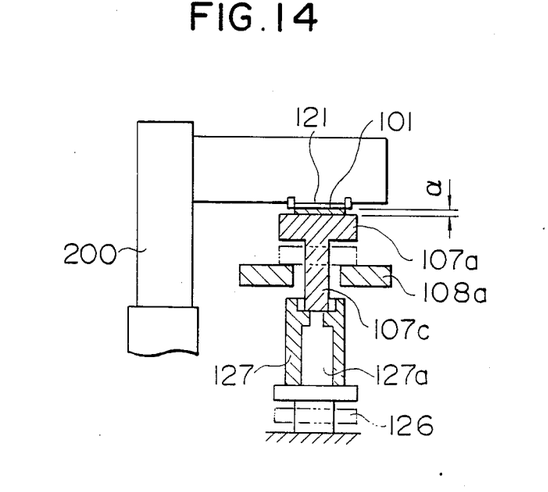
FIG. 14 illustrates another arrangement of the printing station.

In FIG. 14, a board support 107a has a lower projection 107c which extends downwards through a large hole formed in a table 108a. The lower projection 107c can be attracted and fixed to a support 127 disposed on a lift 126 by evacuating a chamber 127a in the support 127 through a piping (not shown). The board support 107a can be lifted by the lift 126 so as to set the distance $\alpha$ between the mask 121 and the board 101.

At the return preparation station 105, a well-known type of chuck may be used to restore the position of the board support 107 the manner the same as in the positioning station. An examination station for examining the state of printing on the board may be provided over the guide 106b and between the printing station 104 and the position 124b. The construction of each of the above-described guides 106a to 106d may be of a well-known type wherein rollers are interposed between upper and lower rails (e.g., a product of THK CO., LTD. having a commercial name "V type Senyo Kido Dai").

What is claimed is:

1. A screen printing method in which constituent elements of an electronic circuit are printed on a board at predetermined positions with desired accuracy maintained by an image processor and an XYθ table, the method comprising the steps of:
preparing a supply/discharge station for supplying a board to be printed and for discharging a printed board, a positioning station for positioning the board by adjusting a recognition mark on the board to a printing reference point by said image processor and said XYθ table, a printing station for performing a desired printing on the positioned board and a return preparation station for returning to said supply/discharge station the printed board on which screen printing has been effected; and
transporting the board successively to said supply/discharge station, to said positioning station, to said printing station, to said return preparation station and again to said supply/discharge station.

2. A screen printing method according to claim 1, further comprising: attracting the board by a vacuum to support the board on a circular index table; and intermittently rotating said index table by a predetermined angle to revolve the board on said index table from said supply/discharge station, to said positioning station, to said printing station, to said return preparation station, and again to said supply/discharge station.

3. A screen printing method according to claim 2, further comprising placing the board on a board support attracted to and supported on said index table by a vacuum, the board being attracted to and supported on said board support by vacuum, cancelling the application of said vacuum to said board through said board support at said supply/discharge station to allow the board to be removed from said board support, and cancelling the application of said vacuum to said board support through said index table at said positioning station to allow said board support to be movable relative to said index table while attracting the board to said board support by said vacuum.

4. A screen printing method in which screen printing is effected on a board by using a mask after the position of the board has been adjusted by an image processor and an XY$\theta$ table to such an extent that the deviation of a recognition mark on the board from a reference point of the mask falls within a predetermined allowance range, said method comprising the steps of:

placing the board on a board support of transportation means which includes said board support for attracting and supporting the board, a transportation table for attracting and supporting said board support and means for transporting said transportation table with a desired accuracy;

conveying, by said transportation means, the board to a positioning station provided with said image processor, camera means, means for clamping said board support and being moveable in the vertical direction and said XY$\theta$ table on which said clamping means is mounted;

at said positioning station, cancelling the attraction of said board support to said transportation table while clamping said board support by said clamping means;

positioning the board by reading the recognition mark of the board by said camera means and by moving said XY$\theta$ table under the command by said image processor;

after positioning, releasing said board support from the clamped state and attracting said board support to said transportation table to enable said board support to be transported by said table while maintaining the board in the positioned state; and conveying the board to said printing station in which screen printing is effected on the board while the distance between the mask and the board in the vertical direction alone is being adjusted to a predetermined value and while the positioned state of the board is maintained.

5. A screen printing method according to claim 4, wherein said transportation means has a vacuum source for attracting the board to said board support and for attracting said board support to said transportation table, and operating valve means for causing said attraction of each of said board and said board support and cancelling the attraction, and a first means for operating said operating valve means is disposed in said positioning station to cancel said attraction of said board support to said transportation table and, thereafter, cause the attraction of the said board support again.

6. A screen printing method according to claim 5, further including the steps of preparing a supply/discharge station from which the board is transported to said positioning station and from which a printed board is discharged, and preparing a second means for operating said operating valve means in said supply/discharge station to cancel the attraction of the printed board to said board support in order to discharge the printed board.

7. A screen printing method according to claim 4, wherein said transportation means transports the board from said positioning station to said printing station along a substantially straight path.

8. A screen printing apparatus comprising:

transportation means for successively transporting a plurality of boards to be printed from a positioning station where each board is positioned to a printing station where printing is performed;

a board support for attracting and supporting each board, said board support being attracted to and supported on said transportation means;

means operative to attract successive board supports to said transportation means and to cancel the attraction;

an actuator for operating said operative means at said positioning station to cancel the attraction of said board support to said transportation means; and image processor means and XY$\theta$ table means operative to move each board support in said positioning station to adjust a recognition mark on a board on the board support to a printing reference point; and said operative means again attracting and supporting the board support on said transportation means to enable said transportation means to transport the thus positioned board to said printing station while maintaining the board in the positioned state.

9. A screen printing apparatus according to claim 8, wherein said image processor means transmits to said XY$\theta$ table means a signal for adjusting the recognition mark on the board to the printing reference point, examines whether or not the recognition mark is coincident with the printing reference point, and further transmits another positioning signal to said XY$\theta$ table if the recognition mark does not coincide with the reference point, thereby causing the recognition mark to substantially coincide with the printing reference point.

10. A screen printing apparatus in which a circular index table on which a board is placed is intermittently rotated so as to transport the board from a positioning station where the board is positioned by an image processor and an XY$\theta$ table to a printing station where screen printing is effected on the board so that elements of an electronic circuit are printed on the board at predetermined positions, said apparatus comprising:

a board support for supporting the board in attracted state, said board support being attracted to and supported on said index table;

means mounted on said index table and operative to attract and support said board support to and on said index table and to cancel the attraction;

an actuator for operating said operative means at said positioning station to cancel the attraction of said board support to said index table;

a support means disposed in said positioning station and operative to support said board support when said board support is released from the attraction to said index table;

image processor means and XY$\theta$ table means disposed in said positioning station and being operative to move said support means relative to said index table so as to adjust a recognition mark on a board on said board support to a printing reference point; and said support means releasing said board support onto said index table and said operative means attracting and supporting said board support to and on said index table again so that the positioned board is conveyed to said printing station by said index table while the board is kept in the positioned state.

11. A screen printing apparatus according to claim 10, wherein said index table is provided with hole means to apply vacuum for attracting said board support to said index table.

12. A screen printing apparatus according to claim 10, wherein said index table is formed therein with a hole for loosely receiving a downward projection extending from a lower surface of said board support, and said support means is capable of attracting and contacting said downward projection and lifting said board support relative to said index table.

13. A screen printing apparatus according to claim 10, wherein said positioning station is provided with camera means operatively associated with said image processor means to detect the recognition mark on the board.

14. A screen printing apparatus according to claim 10, wherein said support means includes a clamp moveable in the vertical direction by a lift mounted on said $XY\theta$ table and capable of clamping said board support, and wherein the positioning of the board is performed such that, said clamp is lifted with said board support from said index table to enable positioning, said $XY\theta$ table is operated on the basis of a signal from said image processor to move said clamp and thus said board support relative to said index table.

15. A screen printing apparatus according to claim 10, said $XY\theta$ table is provided below said index table and said support means is supported by said $XY\theta$ table through lift means constituted by a resilient member and a cylinder and is guided along a substantially straight guide in the vertical direction, said support means being pressed against a projection of said board support only by the force of said resilient member to lift said board support relative to said index table, and said support means being moved downward by said lift means against the force of said resilient member after the board has been positioned.

16. A screen printing apparatus according to claim 10, further comprising a vacuum source provided on said index table, a mechanical valve for applying vacuum to said board support, and an actuator for operating said mechanical valve and provided in an operational station where the vacuum attraction must be cancelled, said actuator being spaced from said index table.

17. A screen printing apparatus according to claim 10, further comprising a vacuum source provided on said index table, an electric valve for applying vacuum to said board support, and means for emitting a control signal to said electric valve, said signal emitting means being provided for an operational station where the vacuum attraction must be cancelled.

18. A screen printing apparatus according to claim 10, further comprising: a rotary shaft disposed at the center of rotation of said index table and serving as a guide for rotation thereof; a vacuum source with operating valves for attracting to and supporting on said index table a predetermined number of board supports on each of which a board can be placed and for controlling the attraction, said vacuum source and said operating valve being mounted on said index table; an axially expandable shaft coupling an end of said rotary shaft to a multipolar motor for intermittently rotating said index table by a predetermined angle; and a support body disposed below said index table and spaced apart from said index table by a predetermined distance while said index table is rotating, said support body attracting said index table downwardly and supporting the same during stoppage of said index table; and a supply/discharge station where boards are supplied and discharged, a positioning station where each board is positioned and a printing station where printing is performed, said supply/discharge station, said positioning station and said printing station being disposed along the periphery of said index table.

19. A screen printing apparatus in which screen printing is effected on a board by a mask after the board has been positioned by an image processor and an $XY\theta$ table such that the offset of a recognition mark on the board from a reference point of the mask falls within a predetermined allowance range, said apparatus comprising:

transportation means including a board support on which the board is supported and attracted thereto, a transportation table on which said board support is supported and attracted thereto, a vacuum source with operating valve means for performing attracting operations, and means for guiding said transportation table with a desired accuracy;

a supply/discharge station where an unprinted board is supplied to said transportation means while a printed board is discharged from said transportation means;

a positioning station provided with an image processor and camera means disposed above a transportation surface of said transportation means, attraction means movable in the vertical direction and operative to attract and support a lower portion of said board support, and an $XY\theta$ table, said attraction means and said an $XY\theta$ table being disposed below said transportation surface at a position opposite to that of said camera means; and a printing station provided with a screen printing mechanism including a vertically movable means capable of positioning the mask at a predetermined distance to the board transported to and placed in said printing station.

20. A screen printing apparatus according to claim 19, wherein said vertically movable means includes a printing table capable of moving in the vertical direction while supporting a lower portion of said board support extending downwardly below said transportation surface.

21. A screen printing apparatus according to claim 19, wherein said guiding means is constituted by linear members so arranged as to define four sides of a quadrilateral such that the linear members disposed in opposed pairs of parallel sides are included in the same plane while the linear members disposed in sides extending at right angles are included in planes of different levels, a traverser on which said table can be moved is provided on each lower linear member, said positioning station and said printing station are disposed in one of the four sides, and said transportation means is circulated successively through said supply/discharge station, said positioning station and said printing station to effect printing on the board.

22. A screen printing apparatus according to claim 19, wherein said positioning station is provided with an operating valve for cancelling attraction of said board support to said transportation table when said board support arrives at said positioning station.

23. A screen printing method in which a plurality of boards to be printed are successively transported by transportation means from a positioning station where positioning of each board is effected to a printing station where each board is printed, said method comprising the steps of:

- transporting each board to said positioning station while the board is fixed to said transportation means;
- at said positioning station, releasing fixation of the board to said transportation means and positioning the board relative to said transportation means to assure that the board is positioned in the correct printing position;
- again fixing the thus positioned board to said transportation means while the board is kept in the positioned state;
- transporting the fixed board to said printing station by said transportation means; and
- performing a screen printing on the board in the positioned state at said printing station.

24. A screen printing apparatus in which a plurality of boards to be printed are successively transported by transportation means from a positioning station where positioning of each board is effected to a printing station where each board is printed, said apparatus comprising:

- means for fixing each board to said transportation means;
- means for releasing fixation of the board to said transportation means at said positioning station;
- means provided in said positioning station to position, relative to said transportation means, the thus released board to assure that the board is positioned in the correct printing position; and
- means for again fixing the thus positioned board to said transportation means while the board is kept in the positioned state;
- the thus positioned board being transported by said transportation means to said printing station to effect a screen printing on the board.

* * * * *